United States Patent
Wang

(10) Patent No.: US 8,791,502 B2
(45) Date of Patent: Jul. 29, 2014

(54) SEMICONDUCTOR DEVICE AND METHOD OF MANUFACTURING THE SAME

(75) Inventor: Guilei Wang, Beijing (CN)

(73) Assignee: The institute of microelectronics Chinese Academy of Science, Beijing (CN)

( * ) Notice: Subject to any disclaimer, the term of this patent is extended or adjusted under 35 U.S.C. 154(b) by 0 days.

(21) Appl. No.: 13/582,433

(22) PCT Filed: Nov. 30, 2011

(86) PCT No.: PCT/CN2011/002002
§ 371 (c)(1),
(2), (4) Date: Sep. 3, 2012

(87) PCT Pub. No.: WO2013/053085
PCT Pub. Date: Apr. 18, 2013

(65) Prior Publication Data
US 2013/0087833 A1    Apr. 11, 2013

(30) Foreign Application Priority Data
Oct. 9, 2011    (CN) .......................... 2011 1 0303593

(51) Int. Cl.
*H01L 29/78* (2006.01)
*H01L 29/51* (2006.01)
*H01L 29/66* (2006.01)
*H01L 29/10* (2006.01)

(52) U.S. Cl.
CPC ...... *H01L 29/1054* (2013.01); *H01L 29/66651* (2013.01); *H01L 29/66522* (2013.01); *H01L 29/66477* (2013.01); *H01L 29/66545* (2013.01); *H01L 29/517* (2013.01); *H01L 29/518* (2013.01)
USPC ............. 257/192; 257/E21.409; 257/E29.255

(58) Field of Classification Search
CPC ................... H01L 29/1054; H01L 21/823412; H01L 27/11556
See application file for complete search history.

(56) References Cited

U.S. PATENT DOCUMENTS

| 6,313,486 | B1 | 11/2001 | Kencke |
| 6,566,734 | B2 | 5/2003 | Sugihara |
| 2009/0039435 | A1* | 2/2009 | Doris et al. .................... 257/369 |
| 2010/0044781 | A1* | 2/2010 | Tanabe .......................... 257/327 |

FOREIGN PATENT DOCUMENTS

CN    102117750 A    7/2011

* cited by examiner

*Primary Examiner* — Mamadou Diallo

(57) ABSTRACT

The present invention discloses a semiconductor device, comprising: a substrate, a channel layer epitaxially grown in the substrate, a gate stack structure on the channel layer, gate spacers on both sides of the gate stack structure, and source/drain areas on both sides of the channel layer in the substrate, characterized in that the carrier mobility of the channel layer is higher than that of the substrate. In accordance with the semiconductor device and the method of manufacturing the same in the present invention, forming the device channel region by filling the trench with epitaxial high-mobility materials in a gate last process can enhance the carrier mobility in the channel region, thereby the device response speed is substantially improved and the device performance is greatly enhanced. Furthermore, traditional materials for a substrate are still used for the source/drain areas of the device to facilitate usage of a gate last process, thereby enhancing the performance while reducing the cost at the same time.

9 Claims, 4 Drawing Sheets

SEMICONDUCTOR DEVICE AND METHOD OF MANUFACTURING THE SAME

CROSS REFERENCE

This application is a National Phase application of, and claims priority to, PCT Application No. PCT/CN2011/082002, filed on Nov. 30, 2011, entitled 'SEMICONDUCTOR DEVICE AND METHOD OF MANUFACTURING THE SAME', which claimed priority to Chinese Application No. CN 201110303593.5, filed on Oct. 9, 2011. Both the PCT Application and Chinese Application are incorporated herein by reference in their entireties.

FIELD OF THE INVENTION

The present invention relates to a semiconductor device and method of manufacturing the same, particularly to a semiconductor device which takes local-epitaxial, high-mobility material film as the channel and a method of manufacturing the same.

BACKGROUND OF THE INVENTION

With continuous reduction in the size of a semiconductor device, enhancing the carrier mobility of channel becomes a very important technique. In the design of a stress layer for a substrate, different materials have different characteristics such as lattice constant, dielectric constant, forbidden gap, particularly carrier mobility, etc., as shown in Table 1 below.

TABLE 1

| Material | Lattice constant (nm) | Dielectric constant | Forbidden gap(eV) | Mobility ($cm^2$/V-s) electron | Mobility ($cm^2$/V-s) hole |
|---|---|---|---|---|---|
| Si | 0.5431 | 11.8 | 1.12 | 1600 | 430 |
| Ge | 0.5675 | 16 | 0.66 | 3900 | 1900 |
| GaAs | 0.5653 | 12.4 | 1.42 | 9200 | 400 |
| InAs | 0.6058 | 14.8 | 0.36 | 40000 | 500 |
| InSb | 0.648 | 17.7 | 0.17 | 77000 | 850 |

It can be seen from Table 1 that among the above possible materials for substrate, Ge has the highest hole mobility and a relatively higher electron mobility. Using Ge as the substrate, particularly the channel region of a semiconductor device will greatly enhance the carrier mobility, thus enabling manufacture of a higher-speed large scale integrated circuit (LSIC).

Further, it can also be seen from Table 1 that Ge has a similar lattice constant as that of the material Si, thus Ge can be easily integrated on a Si substrate commonly used in the semiconductor technology, such that a semiconductor device with better performance can be manufactured by the technology without making great improvements thereto, thereby improving the performance while reducing the cost at the same time.

However, in the prior art, the MOSFETs with the channel region formed of Ge or other non-Si materials all comprise a large area of high-mobility materials deposited in the active region on the Si substrate or completely take high-mobility materials as the substrate, that is, the high-mobility materials can be used in not only the channel region but also the source/drain areas. Actually, it is enough to improve the device response speed by increasing the carrier mobility in the channel region only, and the process cost will be unnecessarily increased if the source/drain areas also adopt non-Si materials. Besides, high-mobility materials such as Ge has a resistivity higher than that of Si, causing the source-drain parasitic series resistance to be increased, thus suppressing the improvement of the device performance to some degree, but the traditional process of taking the metal silicide as source-drain contacts is also hard to be applied to the sources/drain formed by the non-Si high-mobility materials.

Overall, the existing semiconductor device with Si channel has poor performance and reliability, the carrier mobility in the channel region shall be further improved to improve the electrical performance and reliability of the semiconductor device, while the process shall be saved and the cost shall be reduced.

SUMMARY OF THE INVENTION

Therefore, an object of the present invention is to further improve the carrier mobility in a channel region so as to improve the electrical performance and reliability of the semiconductor device while saving process and reducing the cost at the same time.

The present invention provides a semiconductor device, comprising: a substrate, a channel layer epitaxially grown in the substrate, a gate stack structure on the channel layer, gate spacers on both sides of the gate stack structure, and source/drain areas on both sides of the channel layer in the substrate, characterized in that the carrier mobility of the channel layer is higher than that of the substrate.

Wherein the channel layer comprises a buffer layer, a main channel layer and a cladding layer, the main channel layer having a carrier mobility higher than that of the substrate, the buffer layer having a lattice constant between the main channel layer and the substrate, and the cladding layer being formed of the same material as that of the substrate. Wherein the substrate and the cladding layer comprise Si, the main channel layer comprises Ge, and the buffer layer comprises $Si_xGe_{1-x}$ (0<x<1).

Wherein the gate stack structure comprises a gate liner layer, a gate insulating layer, and a gate conductive layer. Wherein the gate liner layer comprises silicon oxide with a thickness of about 1 nm; the gate insulating layer comprises a material selected from a group consisting of silicon oxide, silicon oxynitride, and high-k materials with a thickness of about 1~3 nm; and the gate conductive layer comprises a material selected from a group consisting of doped polysilicon, metals, metal alloy, and metal nitride or the combinations thereof.

Wherein each of the source/drain areas comprises a source/drain extension area and a source/drain heavily-doped area.

Wherein on the source/drain areas and the gate spacers there is a stress layer, on which an interlayer dielectric layer (ILD) is provided, and a hard mask layer is provided on the ILD and the gate stack structure. Wherein the stress layer and/or the gate spacers comprise a material selected from a group consisting of SiN and diamond like amorphous carbon (DLC), and the stress layer has a thickness of about 10~20 nm. Wherein metal silicides are formed on the source/drain areas, and source/drain contact plugs each constituted by a block layer and a source/drain contact layer pass through the hard mask layer, the ILD and the stress layer to be in contact with the metal silicides. the metal silicides comprise a material selected from a group consisting of PtSi, CoSi, NiSi, PtCoSi, PtNiSi, CoNiSi, and PtCoNiSi; and the block layer comprises a material selected from a group consisting of TiN and TaN with a thickness of about 1~7 nm; and the source/drain contact layer comprises a material selected from a group consisting of metal, metal alloy, and metal nitride or the combinations thereof, wherein the metal is selected from Al, W, Ta, and Ti; and the hard mask layer comprises silicon nitride with a thickness of about 10~50 nm.

The present invention also provides a method for manufacturing a semiconductor device, comprising: forming a pseudo gate stack structure on a substrate; forming source/drain areas in the substrate on both sides of the pseudo gate stack structure, and forming gate spacers on the substrate on both sides of the pseudo gate stack structure; removing the pseudo gate stack structure to expose the substrate, thereby forming a gate trench; etching the substrate exposed in the gate trench to form a channel region trench; epitaxially growing a channel layer in the channel region trench, wherein the carrier mobility of the channel layer is higher than that of the substrate; and performing deposition in the gate trench to form a gate stack structure.

Wherein the step of forming the pseudo gate stack structure comprises: sequentially depositing a liner layer and a pseudo gate layer on the substrate, etching to form a pseudo gate stack structure, wherein the liner layer comprises a material selected from a group consisting of silicon oxide and silicon oxynitride, and the pseudo gate layer comprises a material selected from a group consisting of polysilicon, amorphous silicon, and microcrystal silicon.

Wherein the steps of forming source/drain areas and forming gate spacers comprise: performing a first source/drain ion implantation by taking the pseudo gate stack structure as a mask to form source/drain extension areas; forming gate spacers on both sides of the pseudo gate stack structure; performing a second source/drain ion implantation by taking the gate spacer as a mask to form source/drain heavily-doped areas.

Wherein, after forming the gate spacers and before removing the pseudo gate stack structure, further comprising: performing deposition on the source/drain areas, the gate spacers and the pseudo gate stack structure to form a stress layer, which comprises a material selected from a group consisting of SiN and diamond like amorphous carbon (DLC) with a thickness of about 10~20 nm; performing deposition on the stress layer to form an interlayer dielectric layer (ILD), which comprises a material selected from a group consisting of silicon oxide, silicon nitride, phosphosilicate glass (PSG), and low-k materials.

Wherein the step of removing the pseudo gate stack structure comprises: removing the pseudo gate stack structure by using a wet etching liquid including tetramethylammonium hydroxide (TMAH).

Wherein the step of epitaxially growing the channel layer comprises: sequentially depositing a buffer layer, a main channel layer and a cladding layer in the channel region trench by one of ultra-high vacuum chemical vapor deposition (UHVCVD), molecular beam epitaxy (MBE), reduced pressure chemical vapor deposition (RPCVD), and metalorganic chemical vapor deposition (MOCVD), wherein the carrier mobility of the main channel layer is higher than that of the substrate, the lattice constant of the buffer layer is between that of the main channel layer and that of the substrate, and the cladding layer comprises the same material as that of the substrate. Wherein the substrate and the cladding layer comprise Si, the main channel layer comprises Ge, and the buffer layer comprises $Si_xGe_{1-x}$ (0<x<1).

Wherein the step of forming the gate stack structure comprises: sequentially depositing and planarizing by chemical mechanical planarization (CMP) a gate liner layer, a gate insulating layer, and a gate conductive layer in the gate trench, wherein the gate liner layer comprises silicon oxide with a thickness of about 1 nm, the gate insulating layer comprises a material selected from a group consisting of silicon oxide, silicon oxynitride, and high-k materials with a thickness of about 1~3 nm, and the gate conductive layer comprises a material selected from a group consisting of doped polysilicon, metal, metal alloy, and metal nitride or the combinations thereof.

Wherein after forming the gate stack structure, further comprising: forming source/drain contact holes; forming metal silicides on the source/drain areas in the source/drain contact holes; forming source/drain contact plugs in contact with the metal silicides in the source/drain contact holes, wherein each of the source/drain contact plugs comprises a block layer and a source/drain contact layer. Wherein the metal silicides comprise a material selected from a group consisting of PtSi, CoSi, NiSi, PtCoSi, PtNiSi, CoNiSi, and PtCoNiSi; and the block layer comprises a material selected from a group consisting of TiN and TaN with a thickness of about 1~7 nm; and the source/drain contact layer comprises a material selected from a group consisting of metal, metal alloy, and metal nitride or the combinations thereof, wherein the metal is selected from Al, W, Ta, and Ti; and the hard mask layer comprises silicon nitride with a thickness of about 10~50 nm.

In accordance with the semiconductor device and the manufacturing method thereof in the present invention, forming the device channel region by filling the trench with epitaxial high-mobility materials in a gate last process can enhance the carrier mobility in the channel region, thereby the device response speed is substantially improved and the device performance is greatly enhanced. Furthermore, traditional materials for substrate are still used for the source/drain areas of the device to facilitate usage of a gate last process, thereby enhancing the performance while reducing the cost at the same time.

The objects of the present invention and other objects not listed herein are satisfied in the independent claims of the present application. The embodiments of the present invention are defined in the independent claims, and the specific features are defined in the dependent claims.

BRIEF DESCRIPTION OF THE DRAWINGS

The technical solutions of the present invention are described in detail with reference to the drawings below.

DETAILED DESCRIPTION OF THE EMBODIMENTS

The features of the technical solutions of the present invention and the technical effects thereof are illustrated in detail in combination with the schematic embodiments with reference to the drawings, disclosed herein a semiconductor device which takes local-epitaxial, high-mobility materials as the channel and a method of manufacturing the same. It should be pointed out that like reference signs indicate like structures, the terms such as "first", "second", "on", and "below" used in the present invention may be used to modify various device structures or process steps. Except for specific explanations, these modifications do not imply the spatial, sequential or hierarchical relationships of the structures of the modified device or the process steps.

Figure 1:
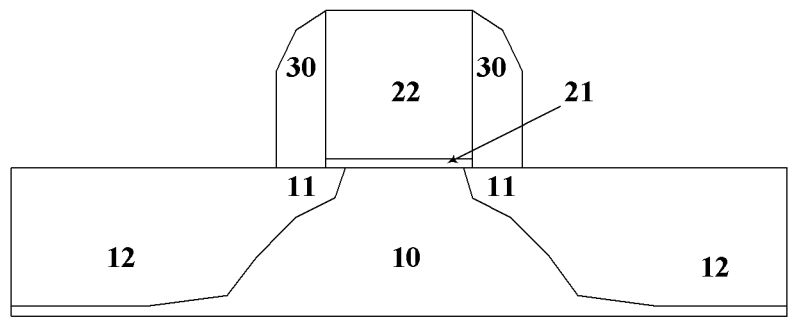
FIGS. 1 to 12 are diagrammatic cross-sections that respectively illustrate the steps of the method for manufacturing the semiconductor device in accordance with the present invention.

First, referring to FIG. 1, a basic structure is formed, that is, a pseudo gate stack structure is formed on the substrate, source/drain areas are formed in the substrate on both sides of the pseudo gate stack structure, and gate spacers are formed on the substrate on both sides of the pseudo gate stack structure. There is provided a substrate 10, which may be common semiconductor Si-based substrates such as bulk Si and silicon on insulator (SOI), bulk Ge and germanium on insulator (GeOI), compound semiconductor substrates such as SiGe, GaAs, GaN, InSb, and InAs, or insulating substrates such as sapphire, SiC, and AlN. The substrate is selected depending on the requirement of the electrical performance of the specific semiconductor device to be manufactured thereon. A substrate containing silicon, i.e., bulk Si, SOI or SiGe is preferred in the present invention. In the invention, the semiconductor device as illustrated in the embodiment may be, for example, a field effect transistor (MOSFET), so in terms of compatibility with other processes and cost control, bulk silicon or SOI is preferred as the material for the substrate 10. A liner layer 21 is deposited on the substrate 10 by a conventional process such as CVD, and the material of the layer may include nitride (e.g., $Si_3N_4$ or SiNx, wherein x is 1~2), oxide (e.g., SiO or $SiO_2$) or oxynitride (e.g., SiON), preferably $SiO_2$. The liner layer 21 is used as a stop layer for the later etch to protect the substrate 10, and the thickness thereof is set depending on the requirement of the etching process. Then, a pseudo gate layer 22, the material of which may include a material selected from a group consisting of polysilicon, amorphous silicon, and microcrystal silicon, is deposited on the liner layer 21 by a conventional process such as CVD, for controlling the gate shape in the gate last process. The liner layer 21 and the pseudo gate layer 22 are etched, and the remained stack structure constitutes a pseudo gate stack structure 20. A first source/drain ion implantation is performed by taking the pseudo gate stack structure 20 as a mask to form lightly-doped, shallow pn-junction source/drain extension areas 11 (i.e., LDD structures) in the substrate 10 on both sides of the pseudo gate stack structure 20. Next, an insulating isolation material is deposited on the entire device surface and etched to form gate spacers 30 on the substrate 10 on both sides of the pseudo gate stack structure 20. Gate spacers 30 comprise a material of nitride, oxide, or oxynitride, which is different from those for the liner layer 21 and the pseudo gate layer 22, for selective etching Particularly, gate spacers 30 may comprise a multi-layer structure (not shown), e.g., a first gate spacer with an L cross-section having a vertical part and a horizontal part, and a high stressed second gate spacer on the horizontal part of the first gate spacer, the second gate spacer may be formed of a material of SiN or diamond like amorphous carbon (DLC), with a stress greater than 2 GPa, preferably. A second source/drain ion implantation is performed by taking the gate spacer 30 as a mask to form heavily-doped deep pn-junction source/drain heavily-doped areas 12 in the substrate 10 on both sides of the gate spacer 30. The source/drain extension areas 11 and the source/drain heavily-doped areas 12 constitute the source/drain areas of MOSFET together, whose doping type, concentration and depth are set depending on the requirement of the electrical performance of the MOSFET semiconductor device.

Figure 2:
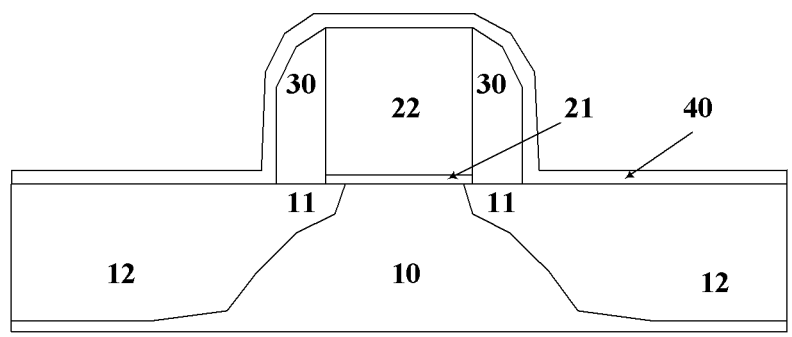

Secondly, referring to FIG. 2, a stress layer is formed. A stress layer 40 is deposited on the entire device surface by a process of filtered cathodic vacuum arc (FCVA), PECVD, or magnetron sputtering to cover the source/drain heavily-doped areas 12, the gate spacers 30 and the pseudo gate layer 22. The stress layer 40 may be formed of SiN or DLC and may have a stress greater than 2 GPa, preferably 4~10 GPa by controlling the deposition process parameter. As for an NMOS, the process parameter is controlled such that the stress layer 40 produces a tensile stress; while for a PMOS, the process parameter is controlled such that the stress layer 40 produces a compressive stress. Besides, the stress layer 40 may also be used as an etch stop layer for source/drain contact holes in the following process, thus the stress layer 40 may also be called as a contact etch stop layer (CESL). The stress layer or CESL 40 can apply a stress to the channel region, to further improve the carrier mobility.

Figure 3:
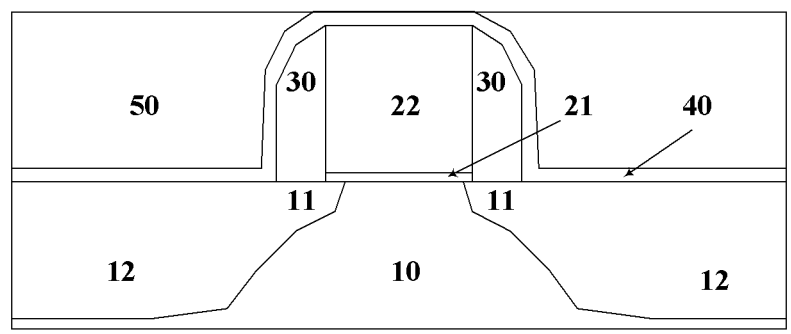

Thirdly, referring to FIG. 3, an interlayer dielectric layer is formed. Deposition is performed on the entire device surface by a conventional process such as LPCVD, PECVD, HDCVD, and spin coating to form an interlayer dielectric layer (ILD) or a pre-metal dielectric (PMD) layer 50, the material of which may include silicon oxide, silicon oxynitride, phosphosilicate glass (PSG), low-k materials including but not limited to organic low-k materials (e.g., aryl-containing or multicyclic organic polymer), inorganic low-k materials (e.g., amorphous carbon nitride thin film, polycrystalline boron nitride thin film, fluorinated silicate glass), porous low-k materials (e.g., silsesquioxane (SSQ)-based porous low-k materials, porous silicon oxide, porous SiOCH, C-doped silicon oxide, F-doped porous amorphous carbon, porous diamond, porous organic polymer). The ILD 50 is planarized by CMP to expose the stress layer 40.

Figure 4:
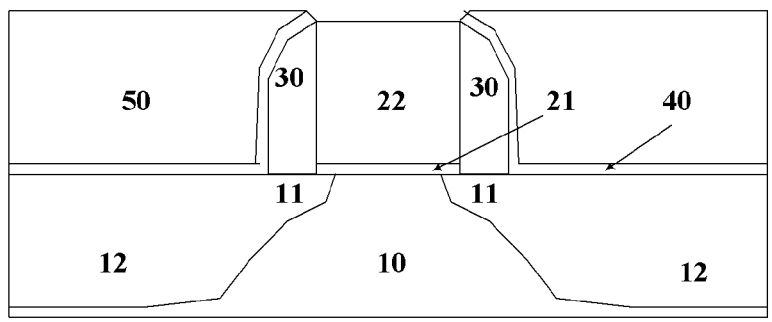

Then, referring to FIG. 4, the stress layer 40 is etched by a selective etching to expose the pseudo gate layer 22. If the stress layer 40 comprises SiN while the pseudo gate layer 22 comprises silicon materials, the stress layer 40 may be removed by wet etching using a hot phosphoric acid. If the stress layer 40 comprises DLC, the stress layer 40 on the top layer is removed by dry etching using $O_2$ and/or Ar plasma, an etch stop point is found by selecting an etching parameter depending on the thickness and material of each layer, and the etch stop point may be slightly lower than the upper surface of the pseudo gate layer 22, that is, the pseudo gate layer 22 may be slightly over etched, e.g., to about 5% of total thickness.

Figure 5:
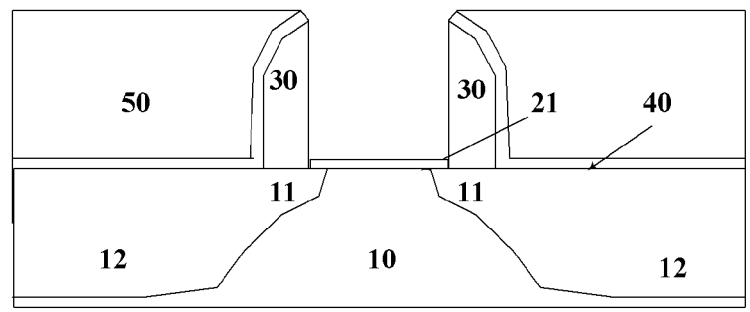

And then, referring to FIG. 5, the pseudo gate layer 22 is removed to expose the liner layer 21. If the pseudo gate layer 22 adopts silicon based materials such as polysilicon, amorphous silicon, and microcrystal silicon while the liner layer 21 adopts oxide, the pseudo gate layer 22 is removed by a wet etching using low-polluting and high-selectivity tetramethylammonium hydroxide (TMAH) under certain concentration and temperature. Furthermore, a dry etching process similar to that for removing the top stress layer 40 may also be used to remove the pseudo gate layer 22. In addition to $O_2$ and/or Ar, halogen-containing gases such as HBr, HCl, $Cl_2$ and $Br_2$, fluorine-containing gases such as fluorocarbon-based gas ($CF_xH_y$), $SF_6$, and $NF_3$ may be added in the plasma used in the dry etching process. Similarly, an etch stop point is found by selecting an etching process parameter depending on the material and thickness, and a slight over etching may also be performed.

Figure 6:
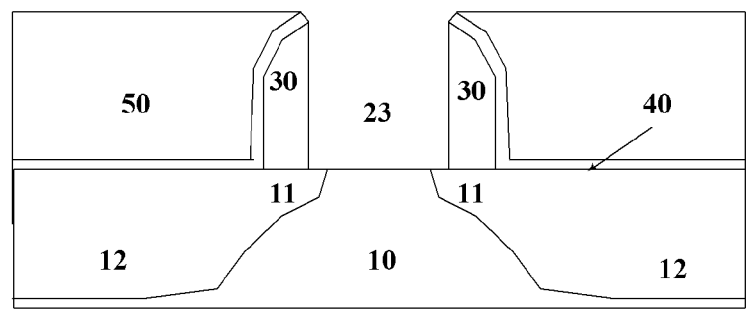

Next, referring to FIG. 6, the liner layer 21 is removed to expose the substrate 10, leaving a gate trench 23. If the liner layer 21 adopts silicon oxide, HF-based wet etching liquids such as dilute HF acid (HDF) or attenuation etching liquids (mixture of BOE, HF and $NH_4F$) may be selected. Similar to the above, dry etching may also be used.

Figure 7:
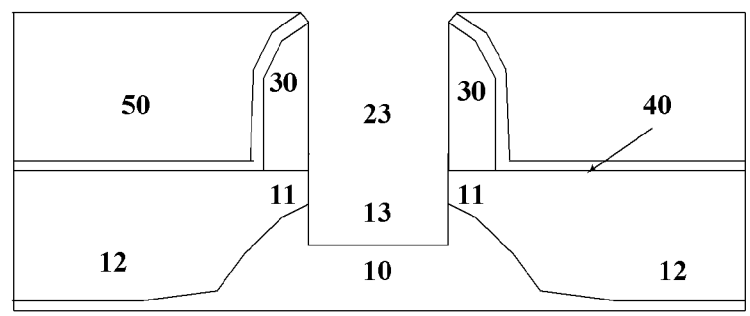

Thereafter, referring to FIG. 7, the exposed substrate 10 is further etched to form a channel region trench 13. For example, TMAH wet etching or plasma dry etching is used to etch the substrate to a certain depth so that the formed channel region trench 13 is in communication with the gate trench 23. The depth of the channel region trench 13 is set depending on the requirement of the electrical performance of the device, for example, if the thickness of the channel region of the device needs to be 50 nm, the depth for the channel region trench 13 shall be greater than or equal to 50 nm.

Figure 8:
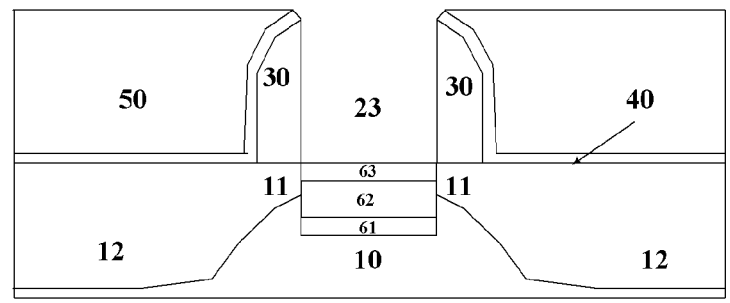

Consequently, referring to FIG. 8, a channel layer 60 is selectively and epitaxially deposited in the channel region trench 13. The material for the channel layer 60 is different from that of the substrate 10 or the source/drain areas, and the carrier mobility thereof is higher than that of the substrate 10. In the embodiment of the present invention, the channel layer 60 comprises Ge, preferably pure Ge film, or a material selected from a group consisting of GaAs, InAs, InSb and SiGe in accordance with Table 1. The epitaxial deposition may be performed by one of reduced pressure chemical vapor deposition (RPCVD), ultra-high vacuum chemical vapor deposition (UHVCVD), molecular beam epitaxy (MBE), and metalorganic chemical vapor deposition (MOCVD) etc. The deposition is preferred as low temperature deposition within a temperature ranging from about 250☐ to 600☐. Gases such as HCL may be added in the feed gas to improve the selectivity of epitaxy, that is, to make the channel layer 60 be deposited only within the channel region trench 13, instead of being on the ILD 50. Preferably, the channel layer 60 may comprise a multi-layer structure, that is, a buffer layer 61 at the bottom, a main channel layer 62 in the middle and a cladding layer 63 on the top. The carrier mobility for the main channel layer 62 is higher than that of the substrate 10, and the material of the layer may include a material selected from a group consisting of pure Ge, GaAs, InAs, InSb, and SiGe in accordance with Table 1. As a transition layer between the substrate 10 and the main channel region layer 62, the buffer layer 61 may have a lattice constant between those for the above two to reduce the interface defects. For example, if the main channel layer 62 is formed of Ge and the substrate 10 is formed of Si, the buffer layer 61 is formed of $Si_xGe_{1-x}$, wherein $0<x<1$. The cladding layer 63 is preferably formed of a material which is the same as that of the substrate 10, e.g., Si. The thickness for each layer is set depending on the electrical performance of the device. The upper surface of the cladding layer 63 is flush with that of the substrate 10, that is, the bottom of the gate trench 23.

Figure 9:
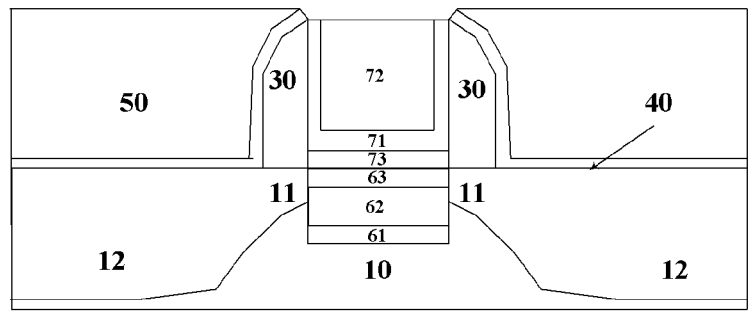

Then, referring to FIG. 9, a gate stack structure 70 is formed in the gate trench 23. First, a gate insulating layer 71 is deposited in the gate trench 23 by a conventional process such as PECVD and HDPCVD to cover the upper surface of the cladding layer 63, sidewalls of gate spacers 30 and ILD 50. The material of gate insulating layer 71 may include one of silicon oxide, silicon oxynitride, high-k materials including but not limited to nitride (e.g, SiN, AlN, TiN), metal oxide (mainly including oxide of subgroup and lanthanide metal element such as $Al_2O_3$, $Ta_2O_5$, $TiO_2$, ZnO, $ZrO_2$, $HfO_2$, $CeO_2$, $Y_2O_3$, $La_2O_3$), and perovskite phase oxide (e.g., $PbZr_xTi_{1-x}O_3$ (PZT), $Ba_xSr_{1-x}TiO_3$ (BST)). The gate insulating layer 71 is preferably formed of a material selected from $HfO_2$ and $La_2O_3$ with a thickness of about 1~3 nm. Further, a gate liner layer 73 with a thickness of about 1 nm is preferably formed between the gate insulating layer 71 and the channel layer 60 (cladding layer 63), the material thereof may be the same as that of ILD 50, both can be oxide such as silicon oxide for reducing the interface defect of high-k materials, thus avoiding to affect the characteristics of the channel region. Then, the gate conductive layer 72 is deposited on the gate insulating layer 71 by a process such as PECVD, MBE, MOCVD, and magnetron sputtering to fully fill the gate trench 23. The gate conductive layer 72 is used to adjust the gate work function to thereby control the threshold voltage, the material thereof may include one of doped polysilicon, doped polycrystalline germanium, metals, metal alloy, and metal nitride or the combinations thereof, wherein the metal may be selected from Co, Ni, Cu, Al, Pd, Pt, Ru, Re, Mo, Ta, Ti, Hf, Zr, W, Ir, Eu, Nd, Er, and La. The gate conductive layer 72 and the gate insulating layer 71 are planarized by CMP to expose the ILD 50, and the remained gate conductive layer 72, gate insulating layer 71 and gate liner layer 73 form a gate stack structure 70.

Figure 10:
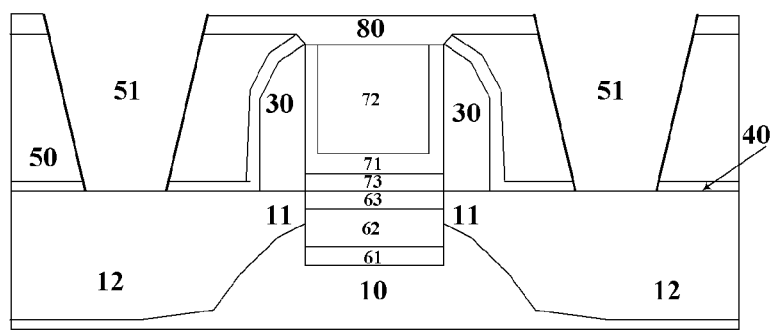

And then, referring to FIG. 10, source/drain contact holes are formed. A hard mask layer 80 formed of silicon nitride with a thickness of about 10~50 nm is deposited on the entire device surface, covering the ILD 50, stress layer 40, gate insulating layer 71, and gate conductive layer 72. Subsequently, the hard mask layer 80 is coated with a photoresist (not shown) and then developed, and the hard mask layer 80, ILD 50, stress layer 40 are sequentially etched in the areas corresponding to the source/drain heavily-doped areas 12 by taking the photoresist and the hard mask layer 80 as a mask with a dry etching process of reactive ion etching (RIE), to expose the source/drain heavily-doped areas 12 in substrates 10, thus forming source/drain contact holes 51. The photoresist is then removed.

Figure 11:
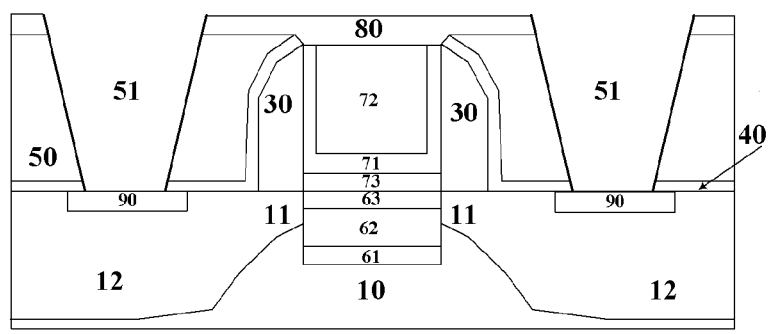

Next, referring to FIG. 11, metal silicides 90 are formed on the source/drain heavily-doped areas 12 exposed in the source/drain contact holes 51. For example, first a metal thin layer formed of one of Pt, Co, Ni or the combinations thereof is deposited in the source/drain contact holes 51, then high temperature annealing is performed so that the metal thin layer reacts with the silicon in the source/drain heavily-doped areas 12 to produce metal silicides 90, thereby greatly reducing the contact resistance. The metal silicides 90 may include a material selected from a group consisting of PtSi, CoSi, NiSi, PtCoSi, PtNiSi, CoNiSi, and PtCoNiSi. Thereafter, the unreacted metal thin layer is stripped off.

Figure 12:
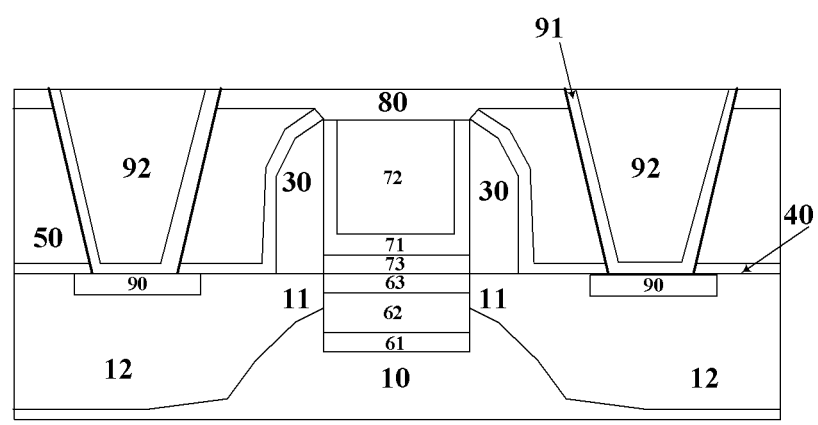

Last, referring to FIG. 12, a block layer 91 and a source/drain contact layer 92 are sequentially deposited and filled in the source/drain contact holes 51 and planarized by CMP to expose a hard mask layer 80, the remained block layer 91 and source/drain contact layer 92 constitute source/drain contact plugs. The block layer 91 comprises a material selected from a group consisting of TiN and TaN with a thickness of about 1~7 nm. The source/drain contact layer 92 comprises a material selected from a group consisting of metal, metal alloy, metal nitride or the combinations thereof, wherein the metal is selected from Al, W, Ta, and Ti. Thereafter, the source/drain contact layer 92 may be etched back such that its top surface is lower than the hard mask layer 80, and the block layers 91 is selectively etched such that it may flush with the source/drain contact layer 92.

The finally obtained MOSFET is as shown in FIG. 12, comprising a substrate 10, a channel layer 60 in the substrate 10, a gate stack structure 70 on the channel layer 60, and source/drain areas (11/12) on both sides of the channel layer 60 in the substrate 10, wherein the carrier mobility of the channel layer 60 is higher than that of the substrate 10. The channel layer 60 comprises a buffer layer 61, a main channel layer 62, and a cladding layer 63. The gate stack structure 70 comprises a gate liner layer 73, a gate insulating layer 71, and a gate conductive layer 72. Gate spacers 30 are further provided on the substrate 10 on both sides of the gate stack structure 70. A stress layer 40 is provided on the source/drain areas and the gate spacers 30. On the stress layer 40 there is an ILD 50. And a hard mask layer 80 is provided on the ILD 50 and the gate stack structure 70. The metal silicide 90 is provided on the source/drain areas. The source/drain contact plugs pass through the hard mask layer 80, ILD 50, and stress layer 40 to be in contact with the metal silicide 90, each of the source/drain contact plugs comprising a block layer 91 and a source/drain contact layer 92. The material, thickness for the above components are as illustrated in the manufacturing method, no more unnecessary details will be provided here.

In accordance with the semiconductor device and the method of manufacturing the same in the present invention, forming the device channel region by filling the trench with epitaxial high-mobility materials in a gate last process can enhance the carrier mobility in the channel region, thereby the device response speed is substantially improved and the device performance is greatly enhanced. Furthermore, traditional materials for a substrate are still used for the source/drain areas of the device to facilitate use of a gate last process, thereby enhancing the performance while reducing the cost at the same time.

Although the present invention has been described with reference to one or more illustrative embodiments, it may be appreciated by those skilled in the art that various appropriate modifications and equivalents can be made to the process flow without departing from the scope of the present invention. Besides, many modifications adaptable to specific situations or materials can be made under the disclosed teaching without departing from the scope of the present invention. Therefore, the present invention does not aim to define the specific embodiments which are disclosed as the preferred embodiments for implementing the present invention, the disclosed device structure and the manufacturing method thereof will include all the embodiments that come within the scope of the present invention.

What is claimed is:

1. A semiconductor device, comprising: a substrate, a channel layer epitaxially grown in the substrate, a gate stack structure on the channel layer, gate spacers on both sides of the gate stack structure, and source/drain areas on both sides of the channel layer in the substrate, characterized in that the carrier mobility of the channel layer is higher than that of the substrate,
   wherein on the source/drain areas and the gate spacers there is a stress layer, on which an interlayer dielectric layer (ILD) is provided, and a hard mask layer is provided on the ILD and the gate stack structure.

2. The semiconductor device according to claim 1, wherein the channel layer comprises a buffer layer, a main channel layer and a cladding layer, the main channel layer having a carrier mobility higher than that of the substrate, the buffer layer having a lattice constant between the main channel layer and the substrate, and the cladding layer being formed of the same material as that of the substrate.

3. The semiconductor device according to claim 2, wherein the substrate and the cladding layer comprise Si, the main channel layer comprises Ge, and the buffer layer comprises $Si_XGe_{1-X}$ (0<x<1).

4. The semiconductor device according to claim 1, wherein the gate stack structure comprises a gate liner layer, a gate insulating layer, and a gate conductive layer.

5. The semiconductor device according to claim 4, wherein the gate liner layer comprises silicon oxide with a thickness of about 1 nm; the gate insulating layer comprises a material selected from a group consisting of silicon oxide, silicon oxynitride, and high-k materials with a thickness of about 1~3 nm; and the gate conductive layer comprises a material selected from a group consisting of doped polysilicon, metals, metal alloy, and metal nitride or any combinations thereof.

6. The semiconductor device according to claim 1, wherein each of the source/drain areas comprises a source/drain extension area and source/drain heavily-doped area.

7. The semiconductor device according to claim 1, wherein the stress layer and/or the gate spacers comprise a material selected from a group consisting of SiN and diamond like amorphous carbon (DLC), and the stress layer has a thickness of about 10~20 nm.

8. The semiconductor device according to claim 1, wherein metal silicides are formed on the source/drain areas, and source/drain contact plugs each constituted by a block layer and a source/drain contact layer pass through the hard mask layer, the ILD and the stress layer to be in contact with the metal silicides.

9. The semiconductor device according to claim 8, wherein the metal silicides comprise a material selected from a group consisting of PtSi, CoSi, NiSi, PtCoSi, PtNiSi, CoNiSi, and PtCoNiSi; and the block layer comprises a material selected from a group consisting of TiN and TaN with a thickness of about 1~7 nm; and the source/drain contact layer comprises a material selected from a group consisting of metal, metal alloy, and metal nitride or the combinations thereof, wherein the metal is selected from Al, W, Ta, and Ti; and the hard mask layer comprises silicon nitride with a thickness of about 10~50 nm.

* * * * *